(12) United States Patent
Steiss

(10) Patent No.: US 6,385,120 B1
(45) Date of Patent: May 7, 2002

(54) POWER-OFF STATE STORAGE APPARATUS AND METHOD

(75) Inventor: Donald E. Steiss, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,783

(22) Filed: Dec. 3, 2001

Related U.S. Application Data

(60) Provisional application No. 60/257,706, filed on Dec. 22, 2000.

(51) Int. Cl.$^7$ .................................................. G11C 7/20
(52) U.S. Cl. ...................... 365/229; 365/228; 365/227; 365/226; 365/149; 365/190; 365/208; 365/207
(58) Field of Search ................................. 365/229, 228, 365/227, 226, 149, 145, 190, 205, 207, 208

(56) References Cited

U.S. PATENT DOCUMENTS

| | | | | |
|---|---|---|---|---|
| 4,646,307 A | * | 2/1987 | Nishimura | 714/54 |
| 4,716,521 A | * | 12/1987 | Nagae | 713/1 |
| 5,768,176 A | * | 6/1998 | Katoh | 365/145 |
| 5,912,835 A | * | 6/1999 | Katoh | 365/145 |

FOREIGN PATENT DOCUMENTS

| | | | | |
|---|---|---|---|---|
| JP | 51-108582 | * | 9/1976 | H01L/29/78 |
| JP | 3-32066 | * | 2/1991 | H01L/29/788 |
| JP | 5-135570 | * | 6/1993 | G11C/11/22 |
| JP | 5-136378 | * | 6/1993 | H01L/27/115 |
| JP | 5-145077 | * | 6/1993 | H01L/29/788 |
| JP | 5-304299 | * | 11/1993 | H01L/29/788 |

* cited by examiner

Primary Examiner—Andrew Q. Tran
(74) Attorney, Agent, or Firm—Robert D. Marshall, Jr.; W. James Brady, III; Frederick J. Telecky. Jr.

(57) ABSTRACT

A circuit for power-off state storage in an electronic device having a positive power supply includes a storage circuit comprising first and second storage capacitors and a write circuit having a plurality of N-type transistors coupled to the storage circuit. The write circuit is operable to write a data bit to the first and second storage capacitors. The power-off state storage circuit also has a sense amplifier connected to the storage circuit and that is operable to read the data bit stored by the storage capacitors. The first and second capacitors in the storage circuit are electrically isolated from the positive power supply such that when the positive power supply is terminated any charge stored on the first and second capacitors is prevented from discharging to the terminated power supply.

22 Claims, 2 Drawing Sheets

POWER-OFF STATE STORAGE APPARATUS AND METHOD

This application claims priority under 35 USC §119(e)(1) of Provisional Application No. 60/257,706, filed Dec. 22, 2000.

TECHNICAL FIELD OF THE INVENTION

This invention relates generally to electronic circuitry and more particularly a power-off state storage apparatus and method.

BACKGROUND OF THE INVENTION

Personal electronics devices are becoming increasingly popular in today's society. Examples electronic devices include computers, cellular phones, personal digital assistants, and calculators. Many people find it desirable to utilize these types of electronic devices in a mobile fashion, remote from a fixed electrical supply. Therefore, many electrical devices utilize batteries for their power supply.

Important to a battery-powered device's marketability is its battery life. Therefore manufacturers take steps to increase battery life by reducing power consumption. One way of reducing power consumption of a powered battery-powered device is to terminate power to components of the device when those components do not require power. For example, a microprocessor embedded in a wireless phone that controls the phone keypad may be shut down and restarted once every millisecond to save power. The problem that this creates is uncertainty in the state of the microprocessor when power was terminated. In other words, it important to know what values were stored in certain registers, but this is difficult if power is terminated to those registers.

One way manufacturers have addressed this problem is to provide persistent memory that retains its stored values for a long period of time after power is terminated to the memory. Examples of persistent memory include flash and ferromagnetic memory. However, these types of memory require additional fabrication steps and significantly increase the cost of the associated electronic device.

SUMMARY OF THE INVENTION

Accordingly a need has arisen for a power-off state storage apparatus and method. The present invention provides a method and apparatus that addresses shortcomings of prior systems and methods.

According to one embodiment of the invention, a circuit for power-off state storage in an electronic device having a positive power supply includes a storage circuit comprising first and second storage capacitors and a write circuit having a plurality of N-type transistors coupled to the storage circuit. The write circuit is operable to write a data bit to the first and second storage capacitors. The power-off state storage circuit also has a sense amplifier connected to the storage circuit and that is operable to read the data bit stored by the storage capacitors. The first and second capacitors in the storage circuit are electrically isolated from the positive power supply such that when the positive power supply is terminated any charge stored on the first and second capacitors is prevented from discharging to the terminated power supply.

According to another embodiment of the invention, a method for storing data while power is terminated to an electronic device includes providing power to the device and providing a storage circuit having at least one storage capacitor electrically isolated from any power in the device such that, when power to the device is terminated, any data stored in the at least one storage capacitor is retained for at least a predetermined time period. The method also includes writing a data bit to the at least one storage capacitor, terminating power to the device and, within the predetermined time period, providing power to the device again, and then sensing the stored data.

Some embodiments of the invention provided numerous technical advantages. For example, some embodiments of the invention allow storage of data when power is terminated to the associated portion of an electronic device. By storing data while power is terminated, battery life may be increased by more frequent termination when certain portions of an electronic device are not used. Furthermore, such advantages may be obtained without the cost of persistent memory, such as flash and ferromagnetic memory.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Figure 1:
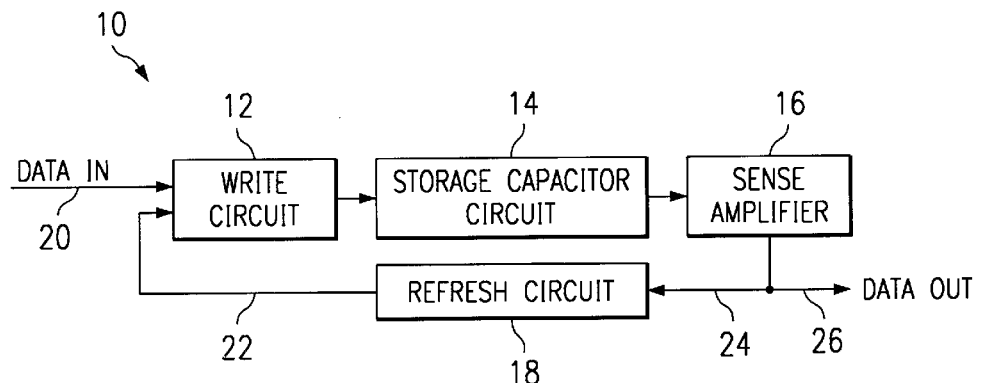
FIG. 1 is a block diagram of a power-off state storage apparatus for storing data when power has been terminated according to the teachings of the invention.
Figure 2:
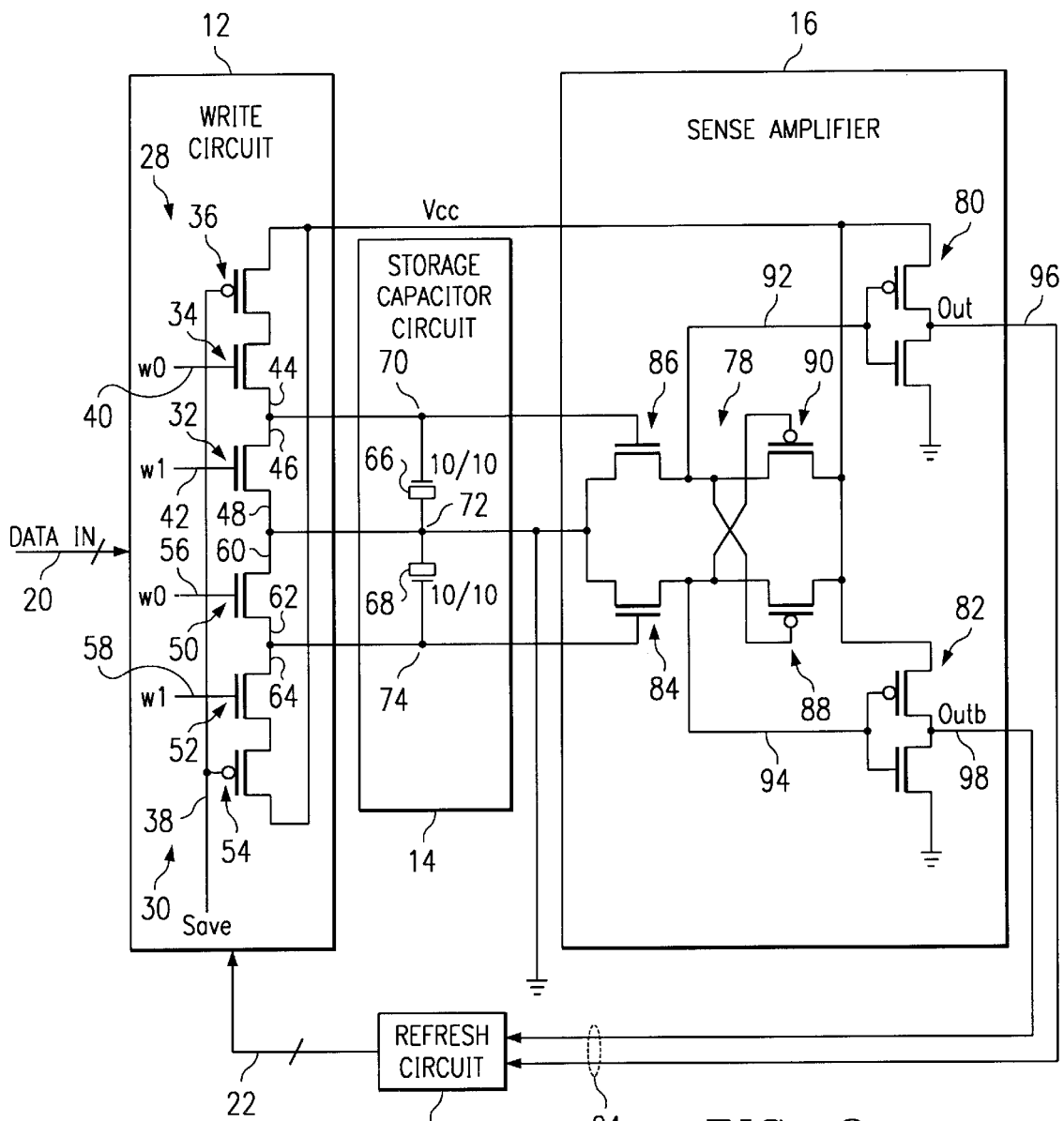
FIG. 2 is a block diagram of the power-off state storage apparatus of FIG. 1 showing additional details of a one embodiment of the invention.
Figure 3:
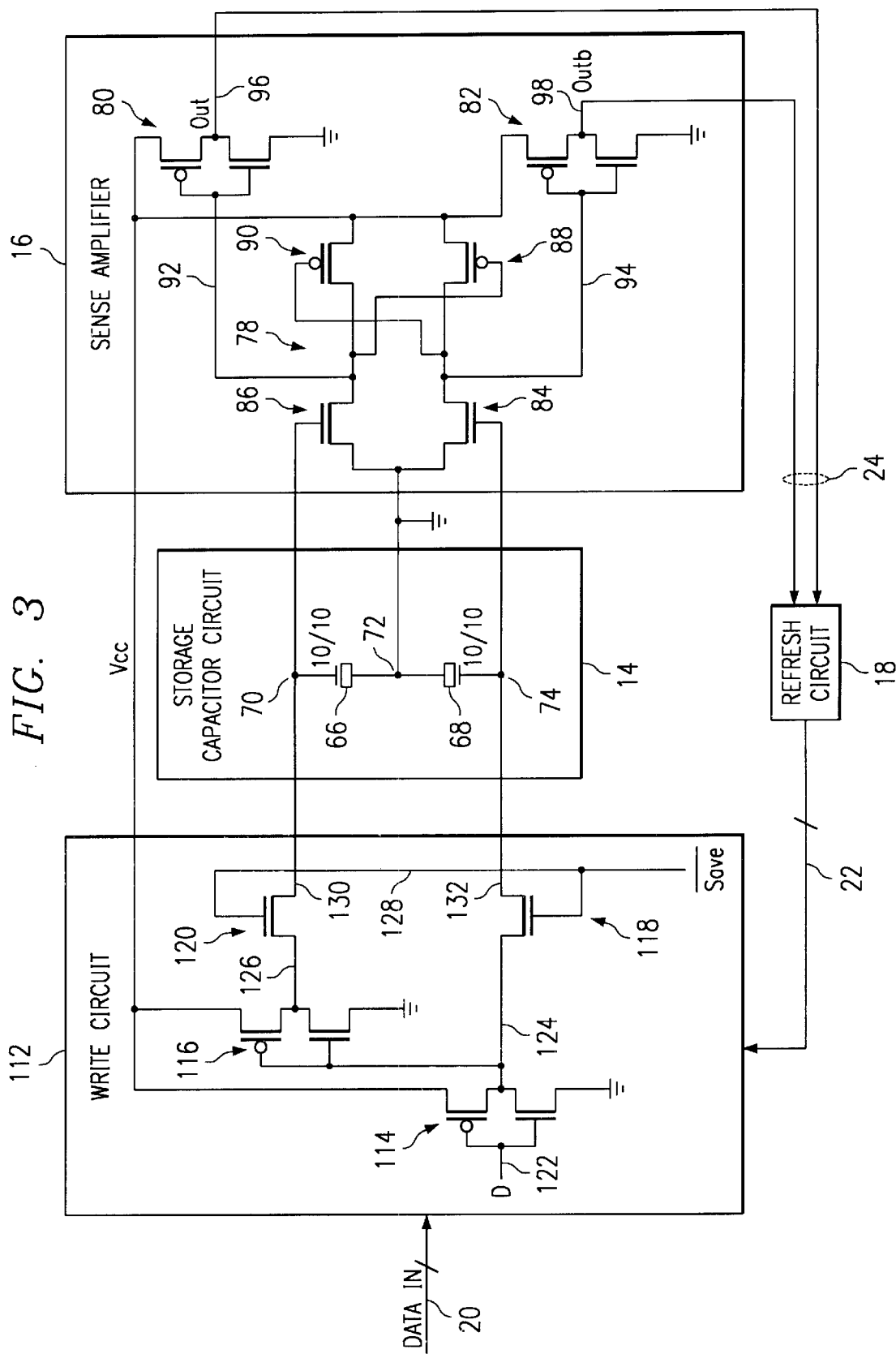
FIG. 3 is a block diagram of the power-off state storage apparatus of FIG. 1 showing additional details of another embodiment of the invention.

Embodiments of the present invention and its advantages are best understood by referring to FIGS. 1 through 3 of the drawings, like numerals being used for like and corresponding parts of the various drawings.

FIG. 1 is a block diagram of a power-off state storage apparatus 10 according to the teachings of the invention. According to the teachings of the invention, power-off state storage apparatus 10, which may also be referred to as a read/write circuit, stores data while power is terminated to the apparatus for subsequent retrieval upon return of power to the apparatus. Poweroff state storage apparatus 10 includes a write circuit 12, a storage capacitor circuit 14, a sense amplifier 16, and a refresh circuit 18. A digital signal processor or other electronic device may include many storage apparatuses 10.

Write circuit 12 receives data from two sources. First, data is received over line 20 from associated circuitry that produces data to be stored. Data is also received by write circuit 12 over line 22 from refresh circuit 18. Data received over refresh circuit 18 on line 22 represents the state of data stored when power was terminated to power-off state storage apparatus 10. Write circuit 12 writes the data to storage capacitor circuit 14 in such a way that when power is terminated to power-off state storage apparatus 10, data remains stored in storage capacitor circuit for a desired time period, as described in greater detail below. Generally, the time period involved with the current invention is on the order of one millisecond to one-hundred milliseconds; however, time periods outside that range may be used without departing from the scope of the current invention.

Sense amplifier 16 retrieves data stored in storage capacitor circuit 14 upon returning power to power-off state storage apparatus 10. Sense amplifier 16 provides the sensed data to refresh circuit 18 over line 24 and also may provide the sensed data to other portions of associated circuitry over line 26. As shown, a separate sense amplifier is used in this embodiment for each bit stored.

According to the teachings of the invention, storage capacitor circuit 14 and write circuit 12 are designed such that storage capacitors within storage capacitors circuit 14 are electrically isolated from any power supply associated with power-off state storage apparatus 10. By doing so, when power is terminated to power-off state storage apparatus 10, no path exists for charge stored in the capacitors to discharge to the former power supply, which after power has been terminated is at a zero voltage level. Therefore, the storage capacitors can retain a charge long enough for power to be returned to the circuit, generally one to one-hundred milliseconds; however, other suitable time periods may be incorporated. This means that write circuit 12 utilizes N-type transistors to write to capacitors within storage capacitors circuit 14 because N-type transistors are "off" when the gate voltage is zero, and any positive bias on the transistor drain terminals results in a non-conducting reverse biased junction from the transistor drain to the substrate. Therefore, unlike the result when using P-type transistors, writing a value to a storage capacitor by a N-type device does not create a path to ground (either due to a zero gate voltage or a forward-biased p+ drain no-substrate) when power is terminated to the device.

Write circuit 12, storage capacitor circuit 14, sense amplifier 16, and refresh circuit 18 may take many suitable forms. Examples of the circuits are provided below in conjunction with FIGS. 2 and 3. FIG. 2 provides an example of write circuit 12, as well as the other circuits, and FIG. 3 provides an alternative example of write circuit 12.

FIG. 2 is a block diagram of the power-off state storage apparatus of FIG. 1, showing additional details of the apparatus. Write circuit 12 includes a pair of transistor trios 28 and 30. Transistor trio 28 is associated with a particular capacitor in storage capacitor circuit 14 and transistor trio 30 is associated with another particular storage capacitor in storage capacitor circuit 14. Transistor trio 28 includes a first N-type transistor 32, a second N-type transistor 34, and a P-type transistor 36. The gate of transistor 36 is connected to a save input line 38; the gate of transistor 34 is connected to a write zero input line 40; and the gate of transistor 32 is connected to a write one input line 42. Transistor 34 has a source 44; transistor 42 has a drain 46; and transistor 32 has a source 48. Transistor trio 30 is analogous to transistor trio 28 and includes the following components: a N-type transistor 50, another N-type transistor 52, and a P-type transistor 54. Transistor 50 has its gate connected to a write zero line 56; transistor 52 has its gate connected to write one line 58; and transistor 54 has its gate connected to save line 38. Transistor 50 had a source 60 and a drain 62; transistor 52 has a source 64.

N-type transistors 32, 34, 50 and 52 may be any N-type transistor suitable for use in storing a data value; however, in this embodiment, transistors 32, 34, 50 and 52 are long-channel transistors. Forming these transistors as long-channel transistors reduces subthreshold leakage current that may occur when power is terminated to write circuit 12 and storage capacitor circuit 14.

Write circuit writes the data to storage capacitor circuit 14 as described below. However, the structure of storage capacitor circuit 14 according to this embodiment is described first. Storage capacitor circuit 14 includes a pair of capacitors 66 and 68. Capacitor 66 is coupled to a charge node 70 and a ground node 72. Capacitor 68 is coupled to ground node 72 and a charge node 74. Charge node 70 is connected to source 44 of transistor 34 and drain 46 of transistor 32. Ground node 72 is coupled to source 48 of transistor 32 and source 60 of transistor 50. Charge node 74 is connected to drain 62 of transistor 50 and source 64 of transistor 52. Ground node 72 is also connected to ground. Capacitors 66 and 68 may take any suitable forms; however, in this embodiment capacitors 66 and 68 are formed from transistors having a length of 10 microns and width of 10 microns. In this example, capacitors 66 and 68 having the same storage capability and have values in the range of 500 fF to 2 pF; however, other suitable storage capacities may be designated.

In addition to being charged by N-type transistors, capacitors 66 and 68 are isolated from any power supply associated with the electronic device. In this example, capacitors 66 and 68 are isolated from power supply Vcc 76.

In operation, write circuit 12 writes data to storage capacitor circuit 14 as follows. A differential voltage between node 70 and 74 is written to represent either a logical one or a logical zero. In this example, writing a logical zero to node 70 and a logical one to node 74 represents a logical one standby storage capacitor circuit, and writing a logical one to node 70 and a logical zero to node 74 represents a logical zero standby storage capacitor circuit. By writing data in such a differential fashion, common mode noise on a ground signal that may occur as power is removed or restored does not corrupt the stored data.

Writing this large differential voltage between nodes 70 and 74 occurs as follows. In order to write a logical one, which in this embodiment means writing a logical zero to node 70 and a logical one to node 74, a logical zero is applied to line 38. Applying a logical zero to line 38 turns on P-type transistor 54 and P-type transistor 36. In addition, a logical one is applied to gates 58 of N-type transistor 52 and gate 42 of N-type transistor 32, turning these transistors on. A logical zero is applied to gate 40 of N-type transistor 34 and gate 56 of N-type transistor 50, turning these transistors off. With transistor 34 turned off, the voltage at drain 46 of transistor 42 is equal to a logical zero. Therefore node 70 is equal to a logical zero. With transistor 54 turned on, transistor 52 turned on, and transistor 50 turned off, source 54 of transistor 52 is equal to the Vcc 76, which is equal to a logical one. Therefore node 74 is at a logical one. The above procedure achieves the desired result of node 70 storing a logical zero and node 74 storing a logical one. In this example, this set of values at nodes 70 and 74 represent a data value of one.

In order to write a logical zero to storage capacitor circuit 14, the following procedure applies. A logical zero is applied to save line 38, turning on transistors 54 and 36. A logical one is applied to gate 40 of transistor 34 and to gate 56 of transistor 50, turning these transistors on. A logical zero is applied to gate 42 of transistor 32 and gate 58 of transistor 52, turning these transistors off. With transistor 36 and 34 on, but transistor 32 off, source 44 of transistor 40 has a voltage equal to a logical one. Therefore, node 70 has a value of a logical one. With transistor 54 on and transistor 52 off, drain 64 is at a logical zero. Therefore node 74 is at a logical zero. The above procedure results in node 70 having a logical one and node 74 having a logical zero, which in this example represents a logical zero stored by storage capacitor 14.

In order to save either a logical zero or a logical one written to storage capacitor circuit 14 in the above-described manner, the following procedure is applied. Save line 38 is set to a logical one, and write lines 56 and 58 are set to logical zero. Doing so turns off all transistors in the two trios 28 and 30, blocking any path for discharging of capacitors 66 and 68. This charge may be retained for several hundred milliseconds, or more, after power has been terminated to the device.

By storing the data in the above-described manner, when power is removed from the circuit, no leakage to power supply Vcc 76 occurs. This is true because only N-type transistors are used to charge the capacitors 66 and 68. In contrast, if P-type transistors were used to charge storage capacitors 66 and 68, the source/drain of the transistors would bias into the associated N-well and positive power supply Vcc 76 as soon as the power supply went below a diode voltage drop of the voltage present on storage capacitors 66 and 68. This retention of charge when power is terminated is also facilitated by the manner in which the charge is sensed by sense amplifier 16, as described in greater detail below in conjunction with the description of details of one example sense amplifier 16.

Sense amplifier 16 operates to read the charge stored in storage capacitor circuit 14 after power has been returned to the device. To do this, in this example, sense amplifier 16 includes a sense amplifier circuit 78, an inverter 80, and another inverter 82. Sense amplifier circuit 78 includes a pair of matched N-type transistors 84 and 86 and a pair of matched P-type transistors 88 and 90. A separate sense amplifier is used, in this embodiment, for each storage capacitor circuit when more than one data bit is stored by multiple storage apparatuses 10. P-type transistors 88 and 90 are gate coupled, meaning that their drains are coupled to the gate of the other P-type transistor. Transistors 84 and 86 have their gates coupled to nodes 70 and 74 and are therefore controlled by the voltage on such nodes. By utilizing a sense amplifier 16 that senses data with the gates of transistors 84 and 86, discharging of the charge stored on nodes 70 and 74 into the sense amplifiers is reduced when power to the circuit is terminated; because only the gates of transistors 84 and 86 are connected to nodes 70 and 74, little discharge occurs through transistors 84 and 86. Therefore, P-type transistors may also be utilized; however, in this example, N-type transistors for 84 and 86 are preferable because N-type transistors are more sensitive to voltage changes where the voltage levels are close to zero volts.

Generally, sense amplifier 16 amplifies the voltage differential present between nodes 70 and 74. This occurs because a voltage differential between nodes 70 and 74 would result in either transistor 86 or 84 being turned on a little more than the other transistor. Positive feedback is provided P-type transistors 88 and 90, resulting in the transistor 84, 86 that is turned on a little bit more being turned on even more. In this manner the voltage differential between nodes 70 and 74 is amplified.

The output of sense amplifier 78 is provided at nodes 92 and 94, which controls inverters 80 and 82 resulting in outputs 96 and 98 for sense amplifier 16. Output 98 is the complement of output 96. Output 96 represents the true value of representation of the voltage differential node 74 and 70 and node 90 represents its complement.

In this embodiment both outputs 96 and 98 are provided to refresh circuit 18 over line 24. Upon power being returned to the circuit, refresh circuit 18 examines the values on output 96 and 98 and applies those values to write circuit 12. Logic for performing these examination and application functions is readily apparent to one skilled in the art and may take many suitable forms. Thus, according to the teachings of the invention, a method of storing a charge while power is terminated to the circuit is provided. This charge can then be rewritten when power is returned to the circuit. The invention allows such storage, but does not require use of the persistent memory, such as flash or ferromagnetic memory. Another embodiment for such a circuit is described below in conjunction with FIG. 3.

FIG. 3 is a block diagram showing yet another embodiment of power-off state storage apparatus 10. This embodiment is substantially similar to the embodiment shown in FIG. 2 except for write circuit 112. Storage capacitor circuit 14, sense amplifier 16, and refresh circuit 18 are as described in FIG. 2 and are not discussed again here for clarity.

Write circuit 112 writes data to storage capacitor circuit 14 for storage. Write circuit 112 includes a pair of inverters 114 and 116 and a pair of N-type transistors 118 and 120. Inverter 114 receives a data input at input line 122 that can be written to storage capacitor circuit 14. If it is desired to write a logical one to storage capacitor circuit 14, a logical one is written on line 122. Conversely, to write a logical zero to storage capacitor 114, a logical zero is written to line 122. Inverter 114 produces on line 124 the complement of the data provided at line 122. Conversely, the output 126 of inverter 116 is the same as the data provided on line 122.

When it is desired to write data, a save line 128, which controls transistors 118 and 120, is brought high. Doing so turns on N-type transistors 118 and 120, passing the data on line 124 and 126 to storage capacitor circuit 14. For example, in order to write a logical one to storage capacitor circuit 14, a logical one is provided at line 122. This results in a logical one being applied at line 130 and a logical zero being applied at line 132. This results in a logical one being applied to node 70 and a logical zero being applied to node 74, which in his embodiment represents a logical one stored in storage capacitor circuit 14. To write a logical zero to storage capacitor circuit 14, a logical zero is applied on line 122 and in the same fashion node 70 stores a logical zero and node 74 stores a logical one, which in this example corresponds to a logical zero stored in storage capacitor circuit 14.

In order to save these values, save line 128 is set to a logical zero, turning off transistors 118 and 120 and allowing no discharge from nodes 70 and 74. The operation of storage capacitor circuit 14, sense amplifier 16, and refresh circuit 18 are as described above in conjunction with FIG. 2.

In this embodiment, write circuit 112 has the advantage of writing to each storage capacitor within storage capacitor circuit 14 with only one transistor. This is desirable because it reduces any parasitic leakage that may occur through the drain diode or gate-to-drain overlap of the N-type transistors. Thus, yet another embodiment of a circuit and a method for storing data after power has been terminated to the circuit has been provided that does not require the use of flash, ferromagnetic, or other types of persistent memory that require additional fabrication cost.

Although the present invention and its advantages have been described in detail, it should be understood that various changes, substitutions, and alterations can be made therein without departing from the spirit and scope of the present invention as defined by the appended claims.

What is claimed is:

1. A circuit for power-off state storage in an electronic device having a positive power supply comprising:
    a storage circuit comprising first and second storage capacitors;
    a write circuit having a plurality of N-type transistors coupled to the storage circuit, the write circuit operable to write a data bit to the first and second storage capacitors;
    a sense amplifier connected to the storage circuit and operable to read the data bit stored by the storage capacitors; and
    wherein the first and second capacitors in the storage circuit are electrically isolated from the positive power supply such that when the positive power supply is terminated any charge stored on the first and second capacitors is prevented from discharging to the terminated power supply.

2. The circuit of claim 1, wherein the write circuit comprises a first pair of N-type transistors coupled to the first storage capacitor and a second pair of N-type transistors coupled to the second storage capacitor.

3. The circuit of claim 2, wherein the first pair of N-type transistors is operable to selectively write either a one or a zero to the first capacitor.

4. The circuit of claim 2, wherein the second pair of N-type transistors is operable to selectively write either a one or a zero to the second capacitor.

5. The circuit of claim 1, wherein the sense amplifier comprises a pair of N-type transistors and a pair of P-type transistors, each N-type transistor of the sense amplifier having a gate controlled by a charge on an associated one of the first and second storage capacitors, each P-type transistor of the sense amplifier having a gate coupled to a drain of an associated one of the N-type transistors of the sense amplifier.

6. The circuit of claim 1, wherein the write circuit comprises first and second N-type transistors having their gates coupled together, the first N-type transistor having a drain connected to the first capacitor and the second N-type transistor having a drain connected to the second capacitor.

7. The circuit of claim 1, wherein the first and second storage capacitors are connected together at a ground node of each capacitor and wherein the first capacitor has another node connected to the drain of one of the N-type transistors and the second capacitor has another node connected to a drain of a different one of the N-type transistors.

8. The circuit of claim 1, wherein the sense amplifier is operable to read a differential voltage from the storage circuit.

9. The circuit of claim 1, wherein the storage circuit comprises first and second capacitors each having one node connected to a ground potential.

10. The circuit of claim 1, where the electronic device is a microprocessor.

11. The circuit of claim 10, where the microprocessor is a digital signal processor (DSP).

12. A method for storing data while power is terminated to an electronic device, the method comprising:
    providing power to the device;
    providing a storage circuit having at least one storage capacitor electrically isolated from any power in the device such that, when power to the device is terminated, any data stored in the at least one storage capacitor is retained for at least a predetermined time period;
    writing a data bit to the at least one storage capacitor;
    terminating power to the device and, within the predetermined time period, providing power to the device again; and
    sensing the stored data.

13. The method of claim 12, and further comprising writing the sensed data to the at least one storage capacitor.

14. The method of claim 12, wherein writing a data bit to the at least one storage capacitor comprising writing a data value to a first storage capacitor and writing the complement of the data value to a second storage capacitor.

15. The method of claim 14, wherein sensing the stored data comprises sensing the stored data from the first and second storage capacitors in a differential manner.

16. The method of claim 12, wherein writing data bit to at least one storage capacitor comprising writing, by at least one N-type transistor, data bit to at least one storage capacitor.

17. A circuit for power off state storage in a device having a positive power supply comprising:
    a plurality of read/write circuits corresponding to a single bit of stored data, each read/write circuit comprising:
        a storage circuit comprising first and second storage capacitors;
        a write circuit having a plurality of N-type transistors coupled to the storage circuit, the write circuit operable to write a data bit to the first and second storage capacitors;
        a sense amplifier connected to the storage circuit and operable to read the data bit stored by the storage capacitors; and
        wherein the first and second capacitors in the storage circuit are electrically isolated from the positive power supply such that when the positive power supply is terminated any charge stored on the first and second capacitor is prevented from flowing to the terminated power supply.

18. The circuit of claim 17, wherein the sense amplifier is operable to read the data bit stored by the storage capacitors and no other data bits stored in any other of the read/write circuits.

19. The circuit of claim 17, wherein the write circuit comprises a first pair of N-type transistors coupled to the first storage capacitor and a second pair of N-type transistors coupled to the second storage capacitor.

20. The circuit of claim 17, wherein the write circuit comprises first and second N-type transistors having their gates coupled together.

21. The circuit of claim 20, wherein the first N-type transistor has a drain connected to the first capacitor and the second N-type transistor has a drain connected to the second capacitor.

22. The circuit of claim 17, wherein the storage circuit comprises first and second storage capacitors each having one node connected to a ground potential.

* * * * *